(12) United States Patent
Abe et al.

(10) Patent No.: US 6,995,468 B2
(45) Date of Patent: Feb. 7, 2006

(54) SEMICONDUCTOR APPARATUS UTILIZING A PREPARATORY STAGE FOR A CHIP ASSEMBLY

(75) Inventors: Shunichi Abe, Tokyo (JP); Tetsuya Uebayashi, Tokyo (JP); Naoki Izumi, Tokyo (JP); Akira Yamazaki, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/798,345

(22) Filed: Mar. 12, 2004

(65) Prior Publication Data

US 2004/0180468 A1    Sep. 16, 2004

Related U.S. Application Data

(62) Division of application No. 10/090,842, filed on Mar. 6, 2002, now Pat. No. 6,784,021.

(30) Foreign Application Priority Data

Sep. 10, 2001    (JP)    ............................. 2001-273082

(51) Int. Cl.
  *H01L 23/34*    (2006.01)
  *H01L 21/48*    (2006.01)
(52) U.S. Cl. ...................... 257/724; 257/777; 257/783; 438/109
(58) Field of Classification Search ..................... None
See application file for complete search history.

(56) References Cited

U.S. PATENT DOCUMENTS

| | | | |
|---|---|---|---|
| 3,591,921 A | 7/1971 | Cosper | |
| 5,090,609 A * | 2/1992 | Nakao et al. | 228/123.1 |
| 5,804,004 A | 9/1998 | Tuckerman et al. | |
| 5,952,725 A | 9/1999 | Ball | |
| 5,979,739 A | 11/1999 | Jin et al. | |
| 6,620,651 B2 | 9/2003 | He et al. | |
| 6,784,021 B2 * | 8/2004 | Abe et al. | 438/109 |
| 2001/0013643 A1 | 8/2001 | Nakanishi et al. | |

FOREIGN PATENT DOCUMENTS

| | | |
|---|---|---|
| JP | 6-151701 | 5/1994 |
| JP | 10-32307 | 2/1998 |
| JP | 10209184 A * | 8/1998 |
| JP | 2000-269243 | 9/2000 |
| JP | 2000-294724 | 10/2000 |
| KR | 20011101 | * 11/2001 |

* cited by examiner

*Primary Examiner*—Alonzo Chambliss
(74) *Attorney, Agent, or Firm*—McDermott Will & Emery LLP

(57) ABSTRACT

In a semiconductor device fabricating method, a plurality of wafers each having a plurality of chips into is carried and is placed in a die bonder. Chips taken out from the plurality of wafers is bonded together, respectively, and superpose in a stack by bonding layers to form a chip assembly. The chip assembly to a die pad by a bonding layer is bonded. Thus, the die bonder is able to bond the chip assembly consisting of the plurality of chips to the die pad, so that the process time of a die bonding process for bonding the plurality of chips to the die pad is comparatively short, the semiconductor fabricating apparatus produces semiconductor devices at an improved productivity, has a comparatively small scale and needs a comparatively low equipment investment.

2 Claims, 3 Drawing Sheets

SEMICONDUCTOR APPARATUS UTILIZING A PREPARATORY STAGE FOR A CHIP ASSEMBLY

This application is a divisional of application Ser. No. 10/090,842 filed Mar. 6, 2002 now U.S. Pat. No. 6,784,021.

BACKGROUND OF THE INVENTION

1. Field of the Invention

The present invention relates to a semiconductor device including a chip assembly formed by stacking a plurality of chips, a method of fabricating the same and a semiconductor device fabricating apparatus.

2. Background Art

A conventional semiconductor device having a high integration level has a plurality of chips of different types stacked on a single die pad for high integration. A method of fabricating such a conventional semiconductor device will be briefly described with reference to FIG. 3 illustrating a process for fabricating the semiconductor device.

Shown in FIG. 3 are a second wafer 1a divided into second chips 3a by dicing, a first wafer 1b divided into first chips 3b by dicing, a first collet 5a for holding and carrying the first chip 3b from the first wafer 1b to a die pad 12 mounted on a stage, a second collet 5b for holding and carrying the second chip 3a from the second wafer 1a to the die pad 12, a second bonding layer 7a for bonding the second chip 3a to the first chip 3b, a first bonding layer 7b for bonding the first chip 3b to the die pad 12, a semiconductor device 15 fabricated by stacking up the chips 3a and 3b, and die bonders 20a and 20b included in a semiconductor device fabricating apparatus.

Referring to FIG. 3, the first wafer 1b is mounted on a wafer holder, not shown, included in the first die bonder 20a. A wafer cassette, not shown, holding a plurality of first wafers 1b therein is carried to the first die bonder 20a. The first wafer 1b is conveyed from the wafer cassette to the wafer holder by a wafer conveying device. The first wafer 1b is divided into a plurality of first chips 3b by dicing.

One of the first chips 3b is picked up from the first wafer 1b by the first collet 5a. The first collet 5a carries the first chip 3b having a back surface coated with the first bonding layer 7b to a position above a stage holding a leadframe provided with a die pad 12.

The stage is heated, the first collet 5a is lowered in the direction of the arrow to press the first chip 3b provided with the bonding layer 7b against the die pad 12 to bond the first chip 3b to the die pad 12. Then, the die pad 12 is carried away from the first die bonder 20a.

The die pad 12 supporting the first chip 3b thereon is carried to a stage, not shown, included in the second die bonder 20b. The second wafer 1a is mounted on a wafer holder, not shown, included in the second die bonder 20b. A wafer cassette, not shown, holding a plurality of second wafers 1a therein is carried to the second die bonder 20b. The second wafer 1a is conveyed from the wafer cassette to the wafer holder by a wafer conveying device. The second chips 3a of the second wafer 1a are of a kind different from that of the first chips 3b of the first 1b; that is, the first chip 3b of the first wafer 1b and the second chip 3a of the second wafer 1a are provided with different elements and circuits, respectively, and have different sizes, respectively.

The second collet 5b picks up one of the second chips 3a of the second wafer 1a having a back surface coated with a bonding layer 7a and carries the same to the stage supporting leadframe provided with the die pad 12.

The stage is heated, the second collet 5b is lowered in the direction of the arrow, and the second chip 3a is pressed against the first chip 3b mounted on the die pad 12 to bond the second chip 3a to the first chip 3b. Thus, the two chips 3a and 3b are stacked on the die pad 12.

The number of the die bonders necessary for carrying out this conventional semiconductor device fabricating method is equal to that of the chips to be stacked on the die pad. A bonding process for bonding the lower chip to the die pad is carried out by a first die bonder, and a bonding process for bonding the upper chip to the lower chip bonded to the die pad is carried out by a second die bonder. Thus, each bonding process needs one die bonder.

If a single die bonder is used for carrying out the plurality of bonding processes, the arrangements of the die bonder must be changed for each bonding process, which reduces the operating ratio of the die bonder. When a plurality of die bonders are assigned to a plurality of bonding processes, respectively, each die bonder operates at a high operating ratio. However, the transfer of one die pad from one to another die bonder needs a comparatively long process time, which is an impediment to the improvement of the efficiency of the semiconductor device fabricating apparatus for the mass production of semiconductor devices. When a plurality of die bonders are used, a large-scale semiconductor device fabricating apparatus is necessary and such a semiconductor device fabricating apparatus needs a large equipment investment.

SUMMARY OF THE INVENTION

The present invention has been made to solve such problems and it is therefore an object of the present invention to provide a semiconductor device fabricating method which can be carried out by a comparatively inexpensive semiconductor device fabricating apparatus of a relatively small scale in a short process time.

Another object of the present invention is to provide a comparatively inexpensive semiconductor device fabricating apparatus of a comparatively small scale capable of fabricating a semiconductor device including a chip assembly formed by stacking a plurality of chips in a short process time.

A third object of the present invention is to provide a semiconductor device including a chip assembly formed by stacking a plurality of chips, and fabricated by the semiconductor device fabricating method according to the present invention using the semiconductor device fabricating apparatus according to the present invention.

According to one aspect of the present invention, in a semiconductor device fabricating method, a plurality of wafers each having a plurality of chips is carried into a die bonder and is placed in the die bonder. A plurality of chips, which is taken out from the plurality of wafers respectively and superposed in a stack, is bonded together by each bonding layer to form a chip assembly. The chip assembly is bonded to a die pad by another bonding layer.

According to another aspect of the present invention, a semiconductor device is fabricated by the above semiconductor device fabricating method.

According to another aspect of the present invention, a semiconductor device fabricating apparatus comprises a plurality of wafer holders for holding a plurality of wafers, respectively. The apparatus comprises a chip conveying device for conveying one chip from each of the plurality of wafers held by the plurality of wafer holders, and a preparatory stage having a support surface on which chips conveyed from the plurality of wafers by the chip conveying device are stacked up and are bonded together by bonding layers to form a chip assembly. The apparatus further comprises a chip assembly conveying device for conveying the chip assembly from the preparatory stage onto a die pad, and a stage on which the chip assembly is bonded to the die pad by a bonding layer.

Other and further objects, features and advantages of the invention will appear more fully from the following description.

DETAILED DESCRIPTION OF THE PREFERRED EMBODIMENTS

Figure 1:
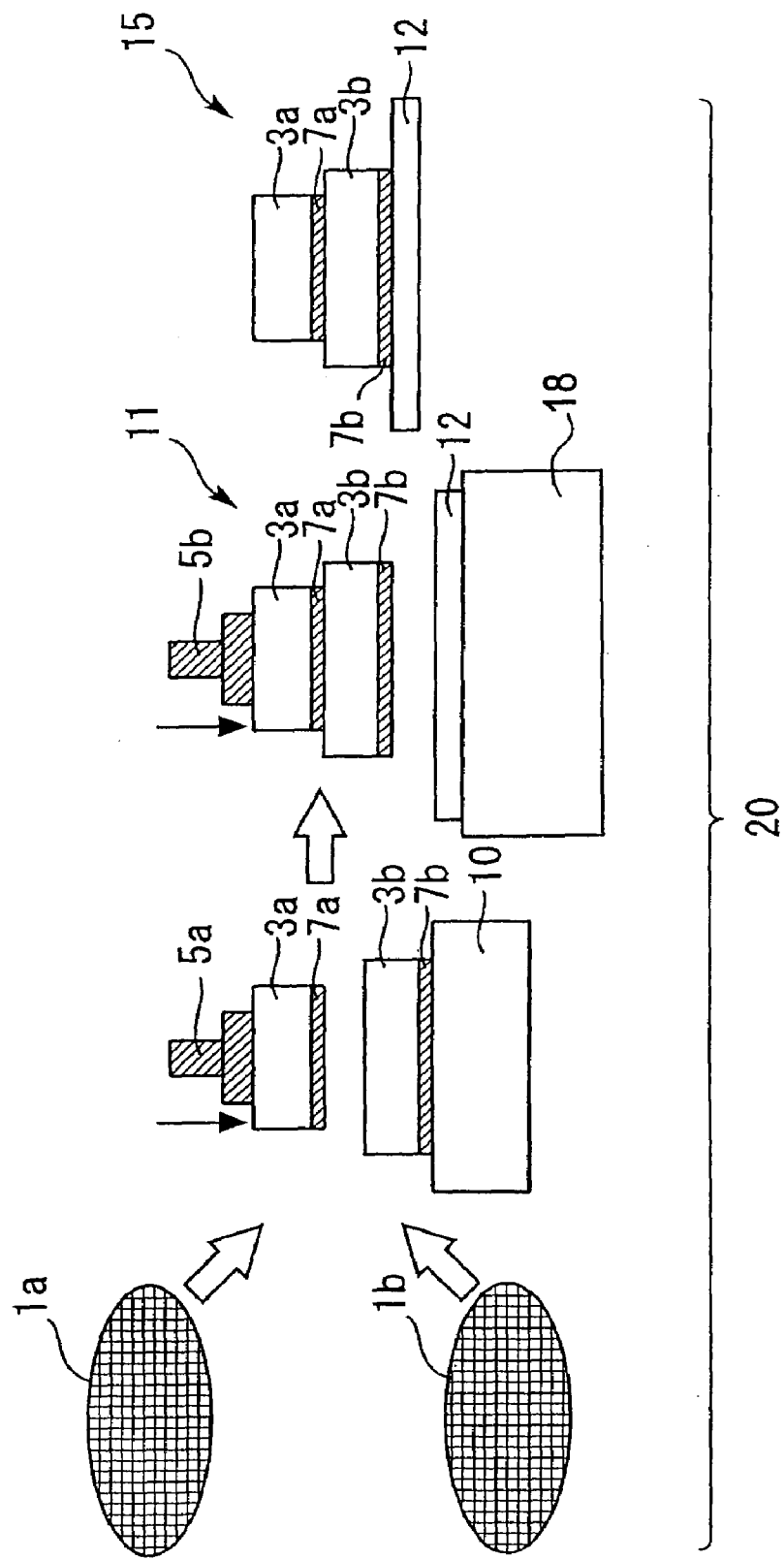
FIG. 1 is a diagram showing the steps of a semiconductor device fabricating method embodying the present invention.

Preferred embodiments of the present invention will be described with reference to the accompanying drawings, in which like or corresponding parts are denoted by the same reference characters and the duplicate description thereof will be omitted.

Embodiment

Figure 2:
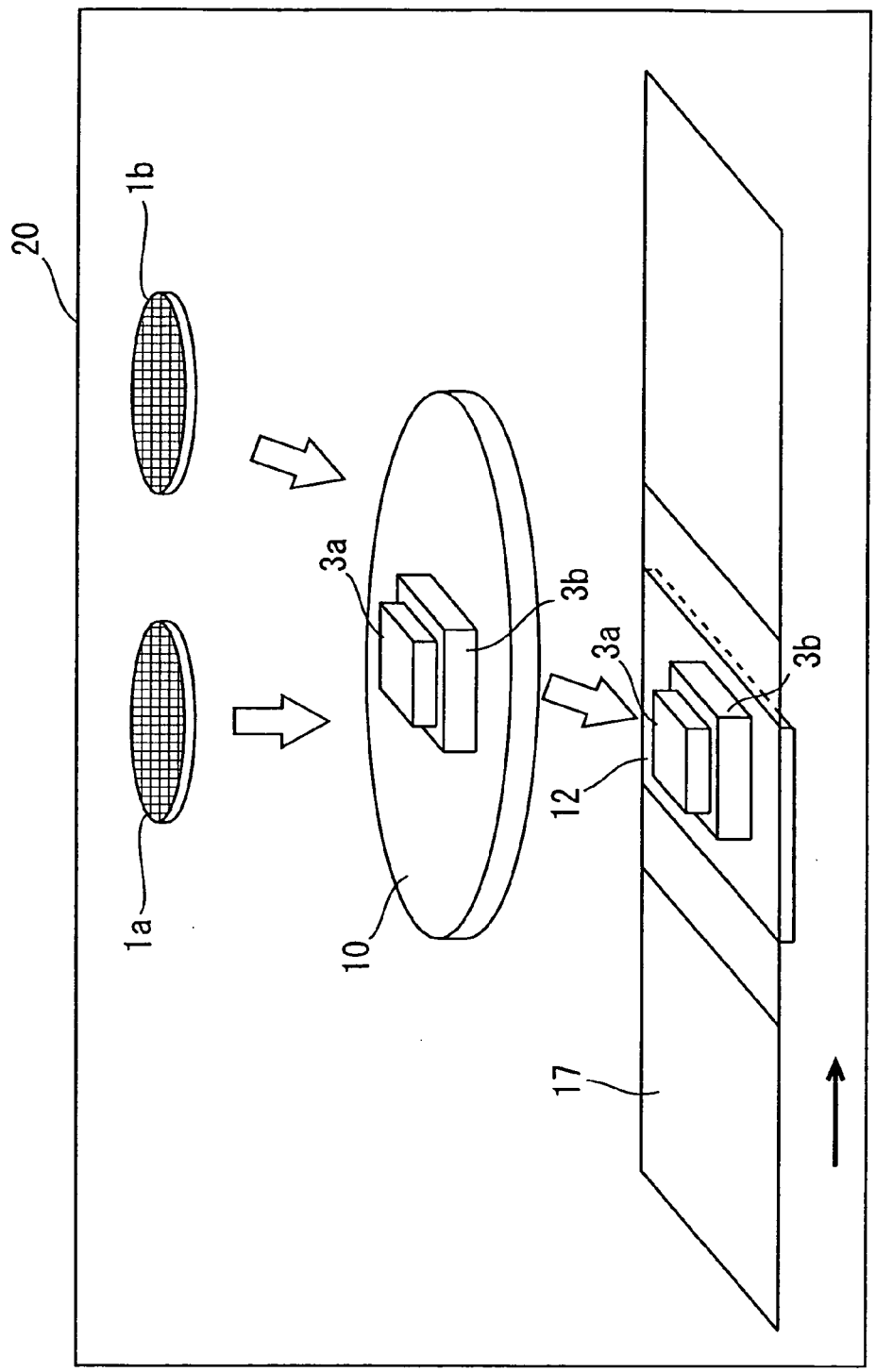
FIG. 2 is a schematic perspective view of a semiconductor device fabricating apparatus embodying the present invention.
Figure 3:
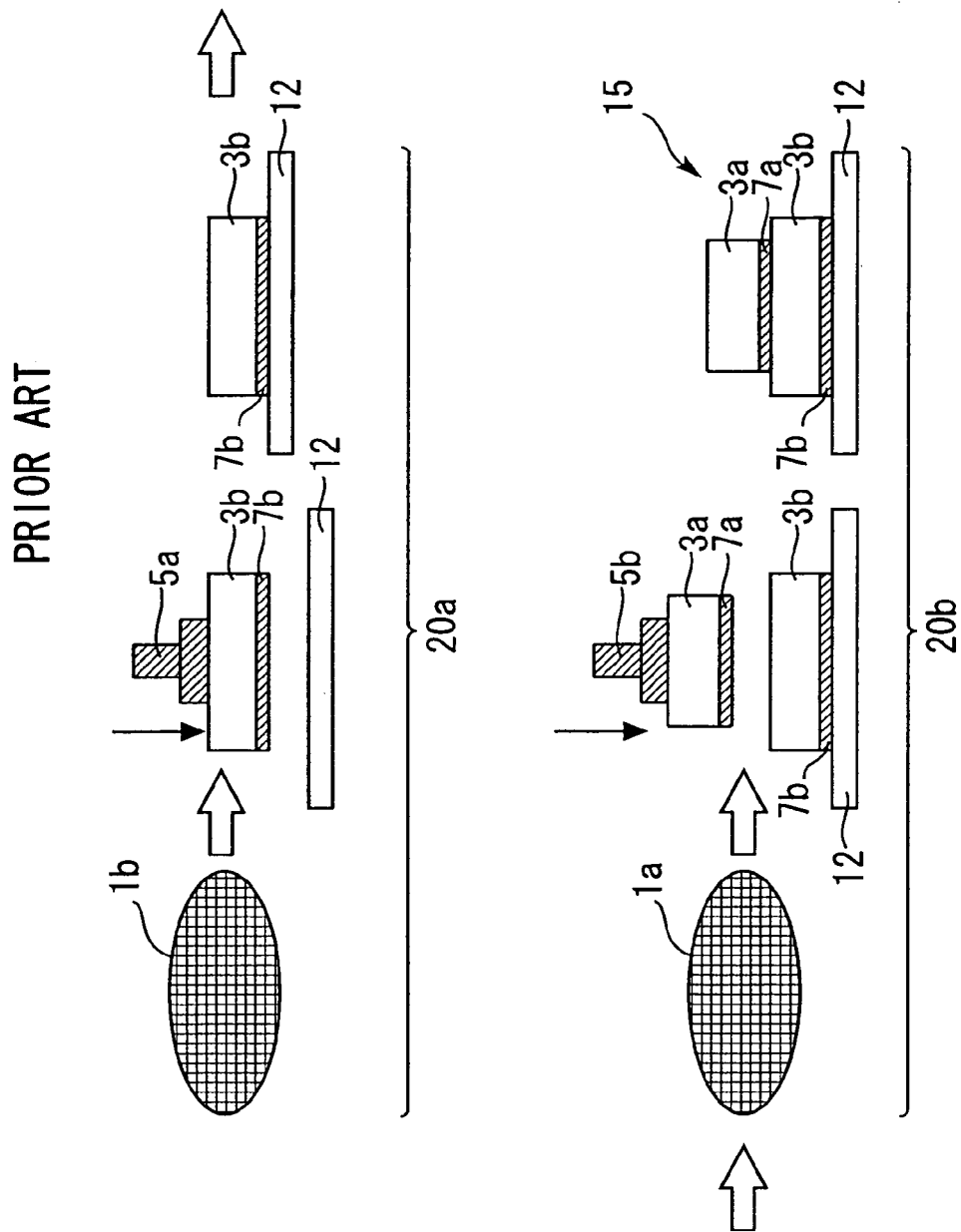
FIG. 3 is a diagram showing the steps of a conventional semiconductor device fabricating method.

FIG. 1 is a diagram showing the steps of a semiconductor device fabricating method embodying the present invention, and FIG. 2 is a schematic perspective view of a semiconductor device fabricating apparatus embodying the present invention.

Shown in FIGS. 1 and 2 are a first wafer 1a divided into first chips 3a by dicing, a second wafer 1b divided into second chips 3b by dicing, a first collet 5a for carrying one of the chips 3a and one of the chips 3b onto a preparatory stage 10, a second collet 5b for carrying a stack 11 of the chips 3a and 3b onto a die pad 12, a first bonding layer 7a bonding together the chips 3a and 3b, a second bonding layer 7b bonding the chip 3b to the die pad 12, a semiconductor device 15 formed by stacking the chips 3a and 3b, a leadframe 17 provided with the die pad 12, and a die bonder 20, i.e., a semiconductor device fabricating apparatus.

Referring to FIG. 1, the first wafer 1a and the second wafer 1b are mounted, respectively, on a first wafer holder and a second wafer holder, not shown, included in the die bonder 20. A first wafer cassette, not shown, holding a plurality of first wafers 1a therein and a second wafer cassette, not shown, holding a plurality of second wafers 1b therein are carried to and placed in the die bonder 20. A wafer conveying device conveys the first wafer 1a from the first wafer cassette to the first wafer holder, and conveys the second wafer 1b from the second wafer cassette to the second wafer holder.

The first collet 5a picks up the chip 3b having a back surface coated with a bonding layer 7b, such as a bonding film, from the second wafer 1b and places the same at a predetermined position on the preparatory stage 10. Subsequently, the first collet 5a picks up the chip 3a having a back surface coated with a bonding layer 7a, such as a bonding film, from the first wafer 1a and places the same on the chip 3b previously placed on the preparatory stage 10.

Then, the preparatory stage 10 is heated and the first collet 5a is lowered in the direction of the arrow to press the chip 3a against the other chip 3b. Thus, the chips 3a and 3b are bonded together to form a chip assembly 11. The upper surface of the preparatory stage 10 with which the chip 3b is in contact is coated with a film of a material scarcely adhesive to the bonding layer 7b. Therefore, only the chips 3a and 3b are bonded together and the chip 3b is not bonded to the preparatory stage 10 even if the preparatory stage 10 is heated and the chips 3a and 3b are pressed against the preparatory stage 10.

Then, the second collet 5b picks up the chip assembly 11 and carries the same toward a stage, instead 18, supporting the die pad 12 thereon. The stage supporting the die pad 12 is heated, and the second collet 5b is lowered in the direction of the arrow to press the chip assembly 11 against the die pad 12. Consequently, the chip assembly 11 is bonded to the die pad 12 to complete a semiconductor device 15.

The lead frame 17 shown in FIG. 2 is provided with a plurality of die pads 12. The lead frame 17 is moved in the direction of the arrow on the stage every time one die bonding cycle is completed to bond chip assemblies 11 successively to the plurality of die pads 12.

The die bonder 20, i.e., the semiconductor device fabricating apparatus, embodying the present invention comprises, as essential components, the plurality of wafer holders, the first collet 5a for carrying the chips 3a and 3b, the preparatory stage 10, the second collet 5b for carrying the chip assembly 11, and the stage for supporting the die pad 12. The semiconductor device 15 fabricated by bonding the chip assembly 11 formed by stacking and bonding together the chips 3a and 3b to the die pad 12 by the die bonder 20 is subjected to a wire bonding process and a packaging process to complete a packaged semiconductor device, i.e., a final product.

The die bonder 20 employed in carrying out the semiconductor device fabricating method embodying the present invention is provided with the preparatory stage 10 for constructing the chip assembly 11 by stacking and bonding together the chips 3a and 3b, in addition to the stage for supporting the leadframe 17. Thus, the die bonder 20 is able to bond the chip assembly 11 consisting of the chips 3a and 3b, i.e., a plurality of chips, to the die pad 12, so that the process time of a die bonding process for bonding the chips 3a and 3b, i.e., a plurality of chips, to the die pad 12 is comparatively short, the semiconductor fabricating apparatus, i.e., the die bonder 20, produces semiconductor devices at an improved productivity, has a comparatively small scale and needs a comparatively low equipment investment.

The bonding layers 7a and 7b coating the back surfaces of the chips 3a and 3b, respectively, are bonding films in this embodiment. The bonding layers 7a and 7b may be layers of a bonding paste. The bonding layer 7a of the bonding paste is formed on a surface of the chip 3b facing the chip 3a before placing the chip 3a on the chip 3b, and the bonding layer 7b of the bonding paste is formed on the upper surface of the die pad 12 facing the chip assembly 11 before placing the chip assembly 11 on the die pad 12.

Although the foregoing embodiment uses the first collet 5a for carrying the chip, and the second collet 5b for carrying the chip assembly, a single collet may be used for both carrying the chip and carrying the chip assembly.

Although the foregoing embodiment uses the single collet 5a for carrying the chips 3a and 3b from the two wafers 1a and 1b to the preparatory stage 10, two collets may be used for carrying the chips 3a and 3b, respectively.

Although the foregoing embodiment places the two wafers 1a and 1b in the die bonder 20, more than two wafers may be placed in the die bonder 20 to form a chip assembly consisting of more than two chips on the preparatory stage 10 and to place a chip assembly consisting of more than two chips on the die pad 12.

The chips 3a and 3b of the chip assembly 11 may be either of the same type or of different types.

One or a plurality of chips may be stacked on the semiconductor device 15 formed by stacking the chips 3a and 3b on the die pad 12 by the foregoing processes according to the present invention. For example, the semiconductor device 15 formed by stacking the chips 3a and 3b may be subjected to the foregoing processes according to the present invention. More specifically, the semiconductor device 15 may be placed in the die bonder 20 and another chip assembly 11 formed by stacking chips on the preparatory stage 10 may be bonded to the semiconductor device 15.

One chip or a chip assembly formed by stacking a plurality of chips may be bonded to the back surface of the semiconductor device 15 formed by stacking the chips 3a and 3b on the die pad 12 by the foregoing processes according to the present invention. For example, the semiconductor device 15 formed by stacking the chips 3a and 3b may be repeatedly subjected to the foregoing processes according to the present invention. More specifically, a chip or a chip assembly formed by stacking chips may be bonded to the back surface of the die pad 12 of the semiconductor device 15. That is, the semiconductor device 15 formed by bonding the chip assembly 11 formed by stacking the chips 3a and 3b may be mounted in an inverted position on the stage of the die bonder 20 with the back surface of the die pad 12 facing up, and another chip assembly 11 formed by stacking chips on the preparatory stage 10 may be bonded to the back surface of the die pad 12 of the semiconductor device 15.

In the semiconductor device fabricating method, one or a plurality of chips may be stacked on the chip assembly.

In the semiconductor device fabricating method, one or a plurality of chips may be stacked on a back surface opposite a surface of the die pad to which the chip assembly is bonded.

In the semiconductor device fabricating method, the die bonder may include a preparatory stage having a support surface on which the chip is placed, and the support surface may inhibit the adhesion of the bonding layer to the support surface.

In the semiconductor device fabricating apparatus, the support surface of the preparatory stage may inhibit the adhesion of the bonding layer to the support surface.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2001-273082, filed on Sep. 10, 2001 including specification, claims, drawings and summary, on which the Convention priority of the present application is based, are incorporated herein by reference in its entirety.

What is claimed is:

1. A semiconductor device fabricating apparatus comprising:
   a plurality of wafer holders for holding a plurality of wafers, respectively;
   a chip conveying device for conveying one chip from each of said plurality of wafers held by said plurality of wafer holders;
   a preparatory stage having a support surface on which chips conveyed from said plurality of wafers by said chip conveying device are stacked up and are bonded together by bonding layers to form a chip assembly;
   a chip assembly conveying device for conveying said chip assembly from said preparatory stage onto a die pad; and
   a stage on which said chip assembly is bonded to said die pad by a bonding layer.

2. The semiconductor device fabricating apparatus according to claim 1, wherein said support surface of said preparatory stage inhibits the adhesion of said bonding layer to said support surface.

* * * * *